United States Patent
Pan et al.

(10) Patent No.: US 6,649,982 B2
(45) Date of Patent: Nov. 18, 2003

(54) INTEGRATION OF BIPOLAR AND CMOS DEVICES FOR SUB-0.1 MICROMETER TRANSISTORS

(75) Inventors: Yang Pan, Singapore (SG); Erzhuang Liu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 4 days.

(21) Appl. No.: 09/872,918

(22) Filed: Jun. 4, 2001

(65) Prior Publication Data

US 2001/0031521 A1 Oct. 18, 2001

Related U.S. Application Data

(62) Division of application No. 09/252,626, filed on Feb. 18, 1999, now Pat. No. 6,284,581.

(51) Int. Cl.⁷ .................... H01L 29/76; H01L 29/94; H01L 31/062; H01L 31/113; H01L 31/119
(52) U.S. Cl. .................... 257/370; 257/378; 438/234; 438/307
(58) Field of Search ................ 257/557, 559, 257/560, 562, 563, 564, 566, 577, 578, 69, 288, 345, 500, 501, 504, 506, 586

(56) References Cited

U.S. PATENT DOCUMENTS

| | | | | |
|---|---|---|---|---|
| 3,966,577 A | * | 6/1976 | Hochberg ............... 204/192 |
| 4,902,639 A | | 2/1990 | Ford ...................... 437/56 |
| 5,065,208 A | * | 11/1991 | Shah et al. ............. 357/34 |
| 5,148,255 A | * | 9/1992 | Nakazato et al. ........ 357/43 |
| 5,439,833 A | * | 8/1995 | Hebert et al. ........... 437/31 |
| 5,471,083 A | * | 11/1995 | Ikeda et al. ............ 257/370 |
| 5,504,362 A | | 4/1996 | Pelella et al. ........... 257/357 |
| 5,606,192 A | | 2/1997 | Harada .................... 257/377 |
| 5,606,202 A | * | 2/1997 | Bronner et al. ......... 257/752 |
| 5,652,154 A | | 7/1997 | Komuro ................... 437/31 |
| 5,681,765 A | | 10/1997 | Darmawan .............. 437/31 |
| 5,793,085 A | | 8/1998 | Vajana et al. ........... 257/370 |
| 5,838,048 A | * | 11/1998 | Hirai et al. ............. 257/378 |
| 5,990,507 A | * | 11/1999 | Mochizuki et al. ...... 257/295 |
| 6,054,741 A | * | 4/2000 | Tokunaga ................ 257/371 |
| 6,150,699 A | * | 11/2000 | Wakabayashi ........... 257/378 |

FOREIGN PATENT DOCUMENTS

JP 354025175 A * 2/1979
JP 354152983 A * 12/1979

* cited by examiner

Primary Examiner—Wael Fahmy
Assistant Examiner—Dana Farahani
(74) Attorney, Agent, or Firm—George O. Saile; Rosemary L. S. Pike; Graham S. Jones, II (57) ABSTRACT

Form a semiconductor device with dielectric, isolation structures in a top surface of a silicon semiconductor substrate, separating the substrate into emitter, NMOS and PMOS areas. Form a gate oxide layer above the isolation structures on the top surface of the silicon semiconductor substrate. Form a conductive polysilicon layer above the thin silicon oxide layer. Mask the NMOS and PMOS regions of the substrate with an emitter mask having a window over the emitter area of the substrate. Ion implant emitter dopant into a portion of the conductive polysilicon layer over the emitter area of the substrate through the window in the emitter mask. Strip the emitter mask. Anneal the substrate including the thin silicon oxide layer, and the polysilicon layer to drive the dopant into an emitter region in the emitter area in the substrate. Form doped source/drain regions and a base in the emitter area of the substrate.

10 Claims, 6 Drawing Sheets

INTEGRATION OF BIPOLAR AND CMOS DEVICES FOR SUB-0.1 MICROMETER TRANSISTORS

This is a division of patent application Ser. No. 09/252,626, filing date Feb. 18, 1999 now U.S. Pat. No. 6,284,581, Erzhuang Liu, assigned to the same assignee as the present invention.

BACKGROUND OF THE INVENTION

1. Field of the Invention

This invention relates to semiconductor devices and more particularly to BiCMOS transistor devices and methods of manufacture thereof.

2. Description of Related Art

U.S. Pat. No. 5,793,085 of Vajana et al. for "Bipolar Transistor Compatible with CMOS Processes" shows a BiCMOS process with ion implanted source/drain and base regions.

U.S. Pat. No. 5,681,765 of Darmawan for "Process for Fabricating Single Polysilicon High Performance BiCMOS" shows a BiCMOS processes with a patterned photoresist layer 80 with an opening above a polysilicon layer 78 with a thickness of about 3250 Å. Dopant 44 is implanted through the opening in the photoresist layer to form a base-emitter region 84 for an eventual bipolar transistor in a tub 68 in an epitaxial layer 60.

U.S. Pat. No. 5,606,192 of Harada for "Semiconductor Integrated Circuits Having Bipolar Transistors and LDD-Structured MOSFET" show BiCMOS processes with polysilicon layers and ion implanting boron ions to form an N-type region in a polysilicon emitter electrode layer 23 formed above a gate oxide layer 12, which in turn is formed above a base layer 19 formed in an N-type epitaxial layer 4 in a P-silicon substrate 1.

U.S. Pat. No. 4,902,639 of Ford for "Process for Making BiCMOS Integrated Circuit Having a Shallow Trench Bipolar Transistor with Vertical Base Contacts" describes a BiCMOS process, but makes a reference to the NMOS region 27 at Col. 3, lines 23–41, to an intermediate stage of manufacturing the NMOS region 27. A second polysilicon layer is deposited on a previous polysilicon layer. The second polysilicon layer is then heavily doped to become a polysilicon N+ layer with an N+ dopant. Alternatively the polysilicon is deposited as a heavily doped layer by an in situ process. Then in NMOS region 27, using a portion of the second polysilicon layer which is now heavily doped polysilicon N+ layer 40, a buried contact region 41 is formed in a P-well region 16 by diffusion, as the result of a high temperature anneal. In Col. 4, lines 4–43, a trench is formed where the NPN transistor is to be formed. First an active base region 67 is formed by implanting boron in the N-well 19. Oxide sidewalls 68 are formed in the trench. A polysilicon emitter 69 is deposited in the trench between the oxide sidewalls 68. Then emitter 69 is doped N-type using masks and implants. By this process or an anneal, a very shallow N-type emitter junction is formed in the active base region from the doping of the polysilicon emitter 69.

U.S. Pat. No. 5,504,362 of Pelella et al., "Electrostatic Discharge Protection Device" in Cols. 7 and 8 and FIG. 2 teaches outdiffusion from N+ polysilicon emitter contact 48/P+ polysilicon base contact 44 to form N+ emitter outdiffusion region 39/P+ base outdiffusion region 40 of an NPN bipolar transistor 15C in a BiCMOS device.

U.S. Pat. No. 5,652,154 of Komuro for "Method for Manufacturing BIMOS Device" shows a process for manufacturing a BiCMOS device. At Col. 5, lines 7–37, an intrinsic base region 109 is formed by ion implantation of a P-type dopant comprising boron into an N-type silicon region C of a P-type silicon substrate 101. Later in the process there is an ion implantation of the polysilicon layer which is first "modified to have an N-type conductivity" by driving dopant from a doped glass layer or by ion implanting N-type dopant into the polysilicon. Then the doped polysilicon is formed into gate electrodes 112a-112c which are to be used to form FET devices in areas A and B and a bipolar device in area C. Then " . . . in area C, the polysilicon layer is left as an emitter electrode 112c above an emitter diffused region forming area for the bipolar transistor." The next step is a heat treatment step employed to form an N-type emitter region 113 in the P type intrinsic region 109. (Col. 5, lines 38–59).

SUMMARY OF THE INVENTION

When the gates of CMOS transistors are scaled to less than 100 nm, the gate oxide thicknesses will be around 5 Å to 40 Å. Under such circumstances, the gate structures of bipolar devices and MOS devices become more similar than the large geometry devices.

In accordance with this invention, a simple approach to structure of bipolar devices and MOS devices is provided. The present invention is very compatible with CMOS process with minimum additional steps to form the self-aligned bipolar transistors in a standard CMOS process.

In accordance with this invention, a semi-conductor device comprises dielectric, isolation structures formed in a top surface of a silicon semiconductor substrate, separating the substrate into emitter, NMOS and PMOS areas. A gate oxide layer is superjacent to (overlies) the isolation structures on the top surface of the silicon semiconductor substrate. A conductive polysilicon layer is superjacent to the thin silicon oxide layer. Emitter dopant has been ion implanted into a portion of the conductive polysilicon layer over the emitter area of the substrate. The substrate including the thin silicon oxide layer was annealed driving dopant from the polysilicon layer into an emitter region in the emitter area in the substrate. Doped source/drain regions are formed in the NMOS and PMOS areas of the substrate, and a base region is formed in the emitter area of the substrate as part of an NPN device. Preferably, annealing was performed by rapid thermal annealing. The gate oxide has a thickness from about 5 Å to about 40 Å. The isolation structures are trenches formed in the substrate filled with silicon oxide dielectric.

In accordance with another aspect of this invention, a semiconductor device comprises dielectric, isolation structures formed in a top surface of a silicon semiconductor substrate, separating the substrate into emitter, NMOS and PMOS areas. A gate oxide layer is superjacent to (overlies) the isolation structures on the top surface of the silicon semiconductor substrate. A conductive polysilicon layer is superjacent to the thin silicon oxide layer. Emitter dopant has been ion implanted into a portion of the conductive polysilicon layer over the emitter area of the substrate. The substrate including the thin silicon oxide layer was annealed driving dopant from the polysilicon layer into an emitter region in the emitter area in the substrate. Doped source/drain regions are formed in the NMOS and PMOS areas of the substrate, and a base region is formed in the emitter area of the substrate as part of an NPN device. Preferably, annealing was performed by rapid thermal annealing. The gate oxide has a thickness from about 5 Å to about 40 Å. The isolation structures are trenches formed in the substrate filled with silicon oxide dielectric.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 5:
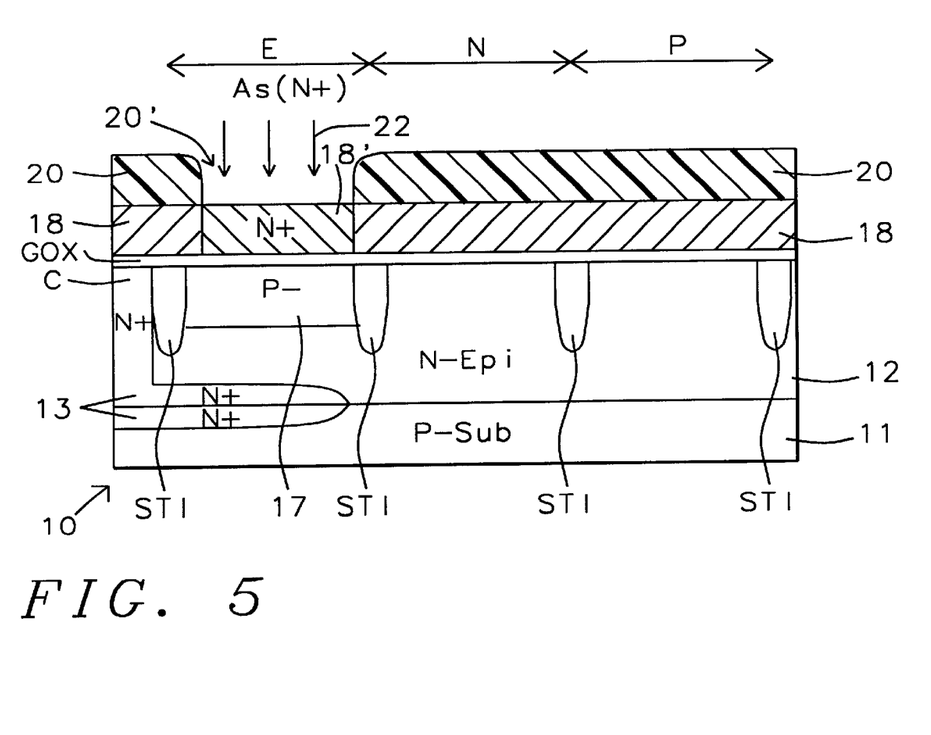
Figure 6:
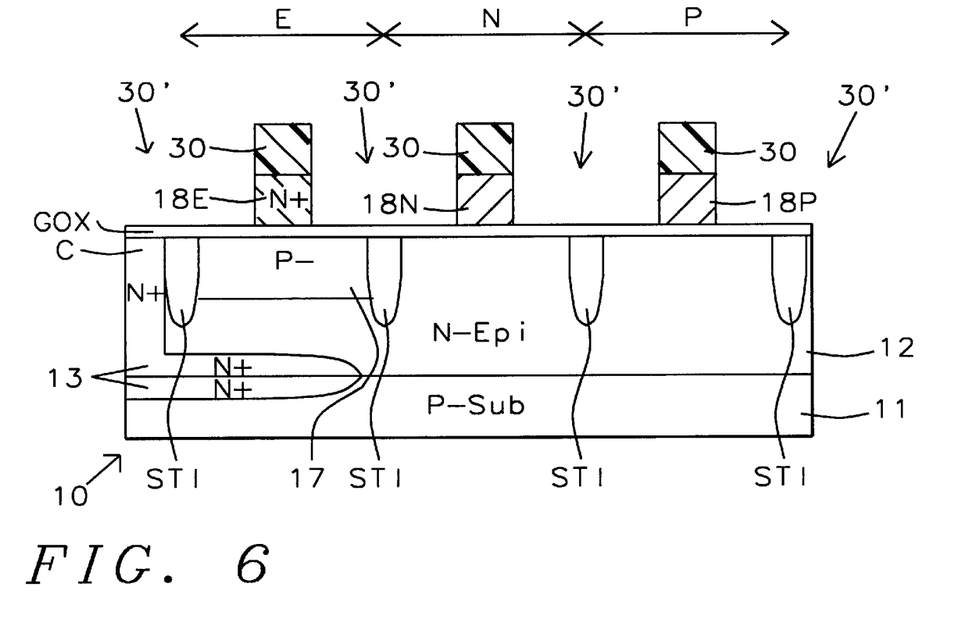
Figure 7:
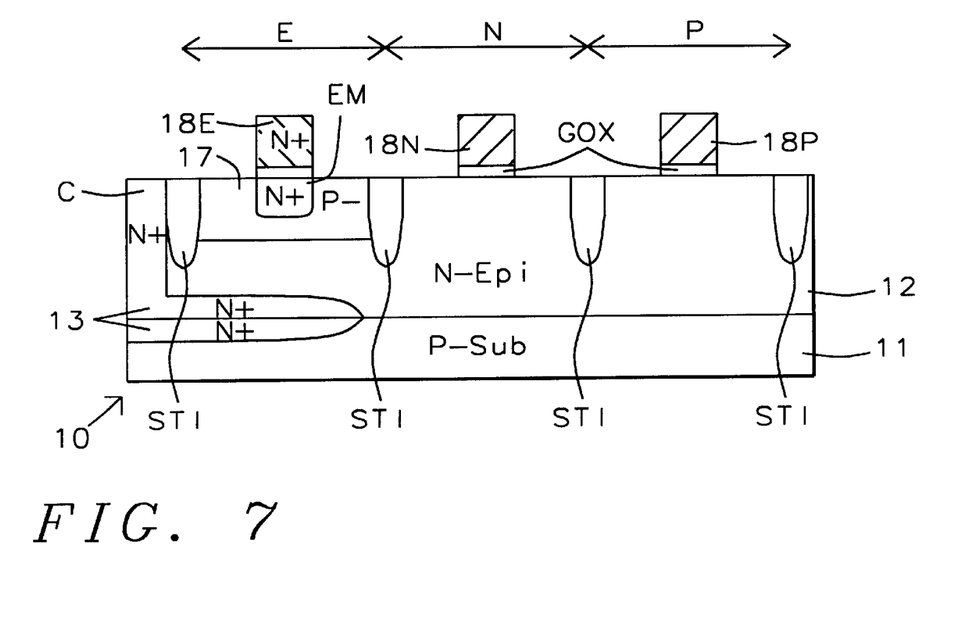

The invention teaches a BiCMOS process for manufacture of a bipolar transistor in a standard CMOS process. Referring to FIGS. 5–7, a fragment of a semiconductor device 10, in accordance with this invention, is shown in an early stage of manufacture. In this stage of the process of the invention shown in FIG. 5, a step is performed of implantation of N type dopant through a bipolar polysilicon emitter opening 20' in a mask 20 to form an N+ doped emitter portion 18' of a polysilicon layer 18. Next, in FIG. 6, the polysilicon is being patterned into N+ doped emitter portion 18E and gate electrodes 18N and 18P. In FIG. 7, the device 10 has been annealed causing formation of an emitter region EM in the silicon semiconductor substrate 12 of the device 10 below the emitter portion 18'.

Process Flow
1) Form STI Isolation Structures and Other Front End Processing.

Figure 1:
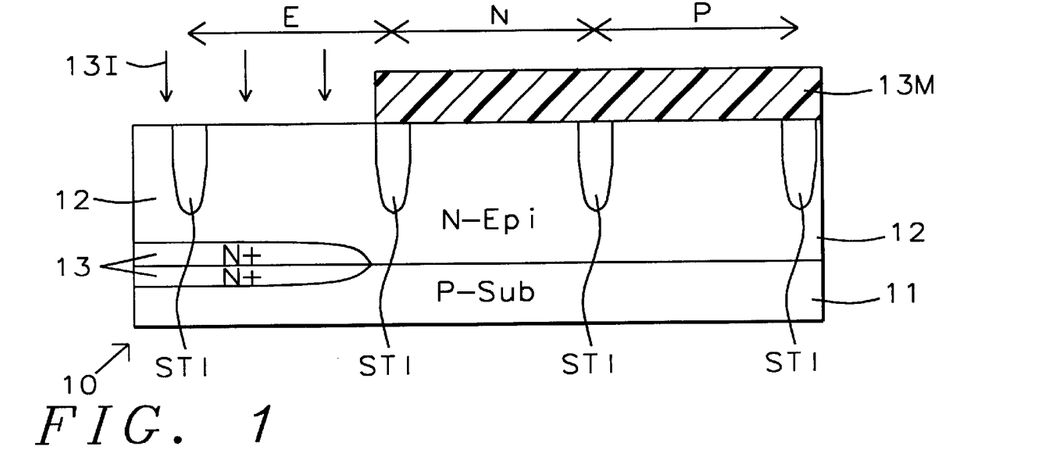
FIGS. 1–12 show a sectional, elevational view of a fragment of a semiconductor device in accordance with this invention, in various stages of the manufacturing process.

FIG. 1 shows a sectional, elevational view of a fragment of a semiconductor device 10 in accordance with this invention in an early stage of manufacture. Semiconductor device 10 includes a P– doped silicon semiconductor substrate 11 on which an N– doped epitaxial (N-Epi) silicon semiconductor layer 12 has been formed.

In N-Epi layer 12, four Shallow Trench Isolation structures STI formed in four equally spaced trenches are shown illustrating a structure in accordance with this invention. Isolation structures STI are filled with silicon dioxide dielectric. The isolation structures STI reach down from the surface of the N-Epi layer 12 to a substantial depth.

The isolation structures STI are provided to isolate the emitter area E which is located on the left end of device 10 from the NMOS area N which is located in the middle of device 10. Area N is also isolated from the PMOS area P which is located on the right end of device 10.

The emitter area E is located between the first and second of the four isolation structures STI from the left. The NMOS area N is between the second and third of the four isolation structures STI from the left. The PMOS area P is between the third and fourth of the four isolation structures STI from the left.

In FIG. 1, a mask 13M has been formed on the surface of N-Epitaxial layer 12 covering the three of the four isolation structures STI from the right, thus exposing the emitter area E between the first and second of the four isolation structures STI from the left. Note that the four isolation structures STI do not reach to the bottom of the N-Epitaxial layer 12, leaving a gap between the top surface of the P-sub 11 and the bottom of each of the four isolation structures STI. The mask and the gap between the left-most isolation structure STI in the N-Epitaxial layer 12 permit the deep implantation of N+ ions 13I in device 10 to form an N+ buried region 13 located both above and below the interface, i.e. straddling the interface between the P-sub 11 and extending across the N-Epitaxial layer 12 through the gap between the top surface of the P-sub 11 and the bottom of the left-most one of the four isolation structures STI. In accordance with a typical BiCMOS process, the BiCMOS devices are formed in a wafer of silicon 11 with a superjacent N-epitaxial layer 12 with an N+ buried region 13 for an NPN transistor formed in an early part of the process, as shown in FIG. 1. The N+ dopant ions 13I can be Antimony (Sb) or Arsenic (As). The dose and the energy level of ions 13I implanted to form N+ doped buried region 13 and the concentration of dopant in N+ doped buried region 13 are all within conventional ranges, as will be well understood by those skilled in the art.

2) Form N+ Collector Plug

Figure 2:
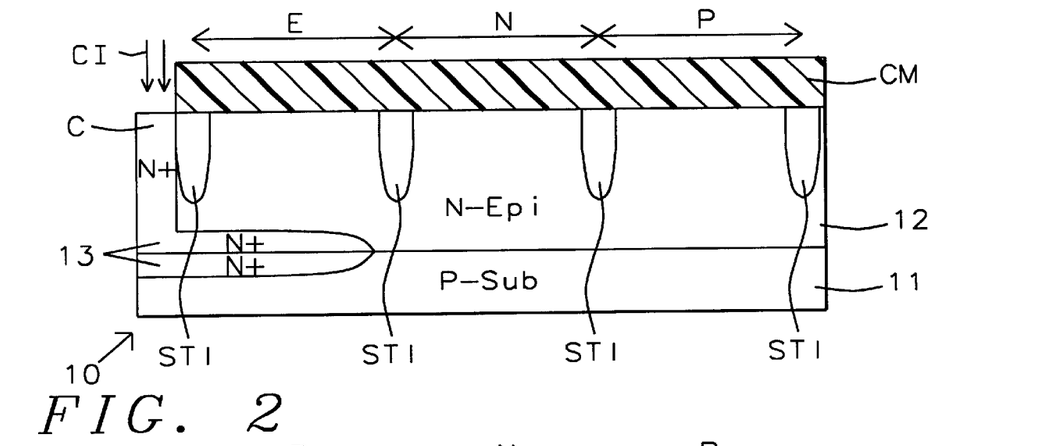

In FIG. 2, the device 10 of FIG. 1 is shown after a mask CM has been formed on the surface of N-Epi layer 12 covering the four isolation structures STI from left of the first isolation structure STI and extending to right. The purpose is to expose an area to the left of the emitter area E to permit implantation of N+ ions CI to form N+ collector plug C to the left of the leftmost isolation structure STI extending from the top surface of N-Epi layer 12 superjacent to and in direct contact with the top surface of the buried N+ region 13. The dose and the energy level of ions implanted to form collector plug C and the concentration of dopant collector plug C are conventional, as will be well understood by those skilled in the art.

3) Grow Gate Oxide

Figure 3:
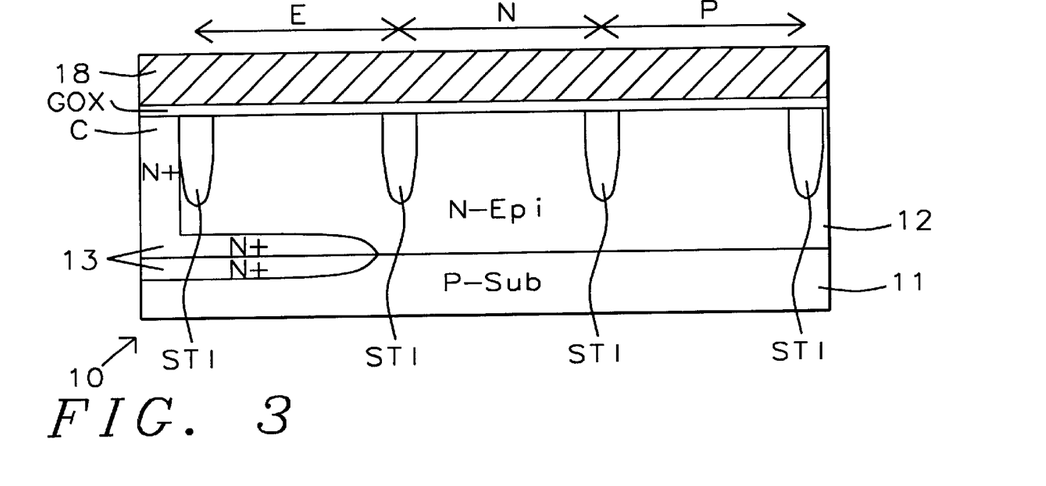

In FIG. 3, the device 10 of FIG. 2 is shown after a blanket gate oxide layer GOX was formed superjacent to and in contact with the top surface of N-Epi layer 12 and the isolation structures STI, i.e. covering N-Epi layer 12 and isolation structures STI. The gate oxide layer GOX is a thin silicon oxide layer having a thickness from about 5 Å to about 40 Å.

4) Form Polysilicon Layer

The device 10 of FIG. 3 also includes a blanket layer of polysilicon 18 was formed superjacent to the gate oxide layer GOX in a subsequent step in a conventional process of fabrication, as will be well understood by those skilled in the art. Polysilicon layer 18 has a thickness typical of the polysilicon employed in FET gate electrodes.

5) Form Mask for Bipolar Transistor Emitter

Figure 4:
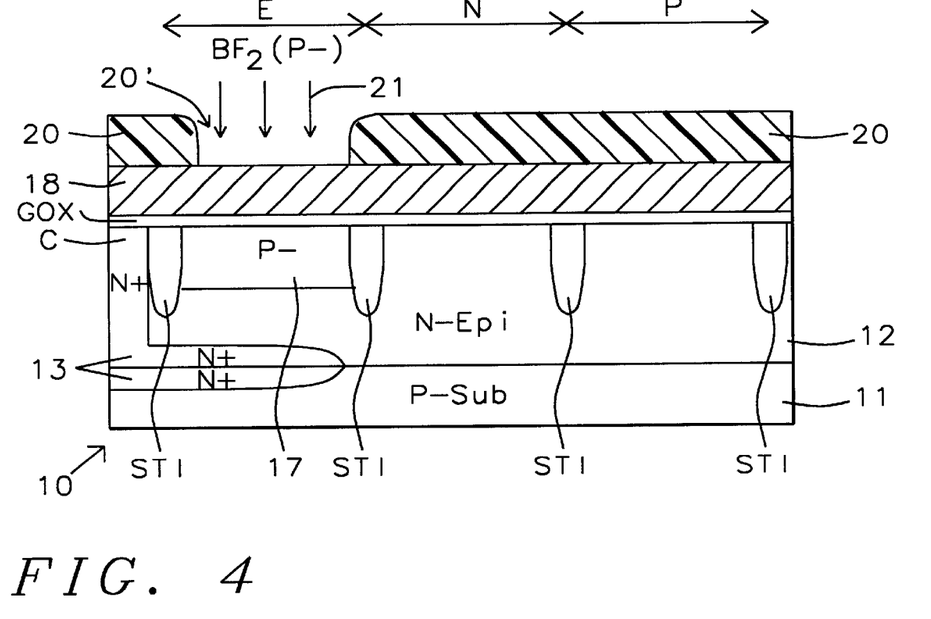

In FIG. 4, the device 10 of FIG. 3 is shown after a photoresist doping mask 20 has been formed superjacent to the blanket layer of polysilicon 18 exposing the surface of polysilicon layer 18, between the first and second STI regions from the left to forms a shallow P– region 17 in the surface of N-Epi layer 12. Mask 20 includes a window 20' between the leftmost two of the four isolation structures STI shown in the emitter area E of the N-Epi layer 12. Ion implantation of boron difluoride ($BF_2$) dopant ions 21 is performed with an energy sufficient to plant the ions 21 in the N-Epi layer 12, below the gate oxide layer GOX. This forms the shallow P-region 17 in the surface of N-Epi layer 12 between the first and second STI regions from the left. The dose and the energy level of ions 21 implanted to form collector plug C and the concentration of dopant in the collector plug C are conventional, as will be well understood by those skilled in the art.

6) Implant Polysilicon for Bipolar Transistors Only.

In FIG. 5, the device 10 of FIG. 4 is shown (with the mask 20 of FIG. 4 remaining in place) while the N+ doped portion 18' of polysilicon 18 (above P– doped region 17 in the emitter area E of N-Epi layer 12) is being ion implanted, through window 20' in mask 20, with N+ ions 22 at an energy from about 20 keV to about 50 keV. The dose of arsenic (N+) dopant ions 22 from about 1 E 15 ions/cm$^{-2}$ to about 1 E 16 ions/cm$^{-2}$ results in a concentration at this stage of the process from about 1 E 19 atoms/cm$^{-3}$ to about 1 E 21 atoms/cm$^{-3}$.

7) Pattern Emitter and CMOS Gates.

In FIG. 6, the device 10 of FIG. 5 is shown after formation of a patterning mask 30 with four large windows 30' therethrough over the polysilicon layer 18 including the portion 18' and used for etching to form an NPN N+ doped emitter portion 18E and CMOS gates 18N and 18P. The four windows 30' of patterning mask 30 are centered over isolation structures STI. Using mask 30 the polysilicon layer 18 has been etched through windows 30' down to the gate oxide layer GOX. The results are N+ doped polysilicon emitter portion 18E formed from N+ doped portion 18' over emitter area E of the N-Epi layer 12, the NMOS gate electrode 18N formed over the N area of N-Epi layer 12 and the PMOS gate electrode 18P formed over the P area of N-Epi layer 12.

8) Rapid Thermal Anneal (RTA) to Drive-in Emitter Dopant.

In FIG. 7, the device 10 of FIG. 6 is shown after etching away portions of the gate oxide layer GOX unprotected by the N+ doped polysilicon emitter portion 18E, the NMOS gate electrode 18N and the PMOS gate electrode 18P.

Next, performance of a rapid thermal annealing process drives the dopant in polysilicon emitter portion 18E down through the portion of gate oxide layer GOX remaining below N+ doped polysilicon emitter portion 18E into a new emitter substrate N+ doped region EM forming in N-Epi layer 12 as a part of the NPN device. N+ doped region EM is self-aligned with the N+ doped polysilicon emitter portion 18E.

9) Form PLDD/PLDS Regions for Bipolar Base and PMOS Regions.

Figure 8:
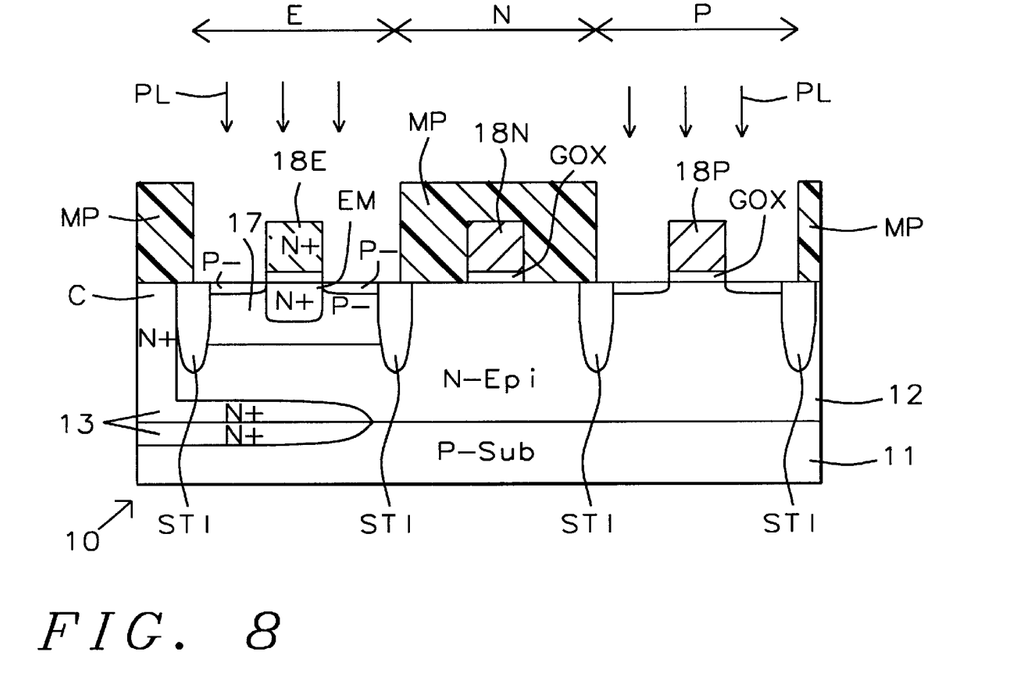

In FIG. 8, device 10 of FIG. 7 is shown after formation of a mask MP exposing the upper surfaces of areas E and P but covering area N during ion implantation of a light dose of P-type boron dopant ions PL into lightly doped drain/source (LDD/LDS) regions P- have been formed for the N+ doped polysilicon emitter portion 18E and gate 18P, self-aligned with both thereof. Dopant ions PL are implanted at an energy from about 0.1 keV to about 50 keV, with a dose from about 1 E 17 ions/cm$^{-2}$ to about 5 E 14 ions/cm$^{-2}$ of resulting in a concentration at this stage of the process from about 1 E 16 atoms/cm$^{-3}$ to about 5 E 18 atoms/cm$^{-3}$.

10) Form P+ Regions for Bipolar Base and PMOS Regions.

Figure 9:
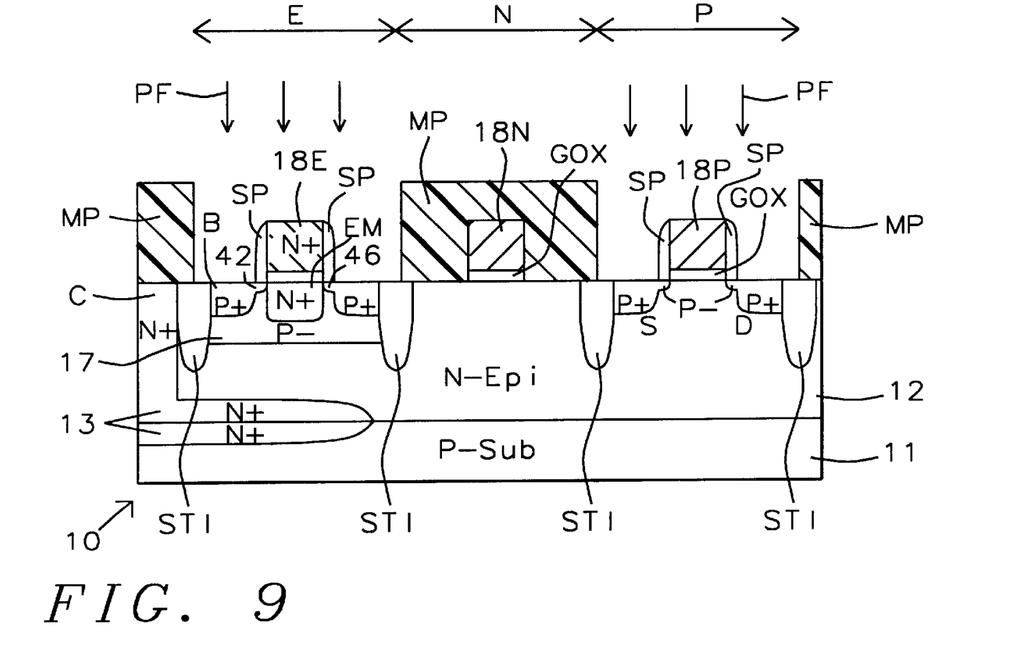

In FIG. 9, device 10 of FIG. 8 is shown with the mask MP remaining after formation of spacers SP on the sides of the polysilicon emitter portion 18E and gate electrode 18P, covering areas on either side of the emitter portion 18E and gate electrode 18P exposing narrower portions of the top surfaces of areas E and P during ion implantation of a full dose of P-type dopant PF for the N+ doped polysilicon emitter portion 18E and gate electrode 18P. Preferably, boron dopant ions PF are implanted with a dose from about 1 E 15 ions/cm$^{-2}$ to about 1 E 16 ions/cm$^{-2}$ at an energy from about 0.1 keV to about 50 keV. A concentration from about 1 E 19 atoms/cm$^{-3}$ to about 1 E 21 atoms/cm$^{-3}$ results at this stage of the process.

The result is a P+ base region B, and a P+ doped region 44 self-aligned with the spacers SP adjacent to emitter portion 18E plus P+ S/D regions self-aligned with the spacers SP adjacent to gate electrode 18P. P+ base region B and P-doped region 41 are located to the left of the emitter portion 18E. P+ doped region 44 and P- doped region 46 are located to the right of the emitter portion 18E. P+ S/D regions and lightly doped (LDD/LDS) regions P- are located to the left and right of the gate electrode 18P in the conventional manner for a PMOS device.

11) Form NTDD/NLDS Regions for the NMOS Regions.

Figure 10:
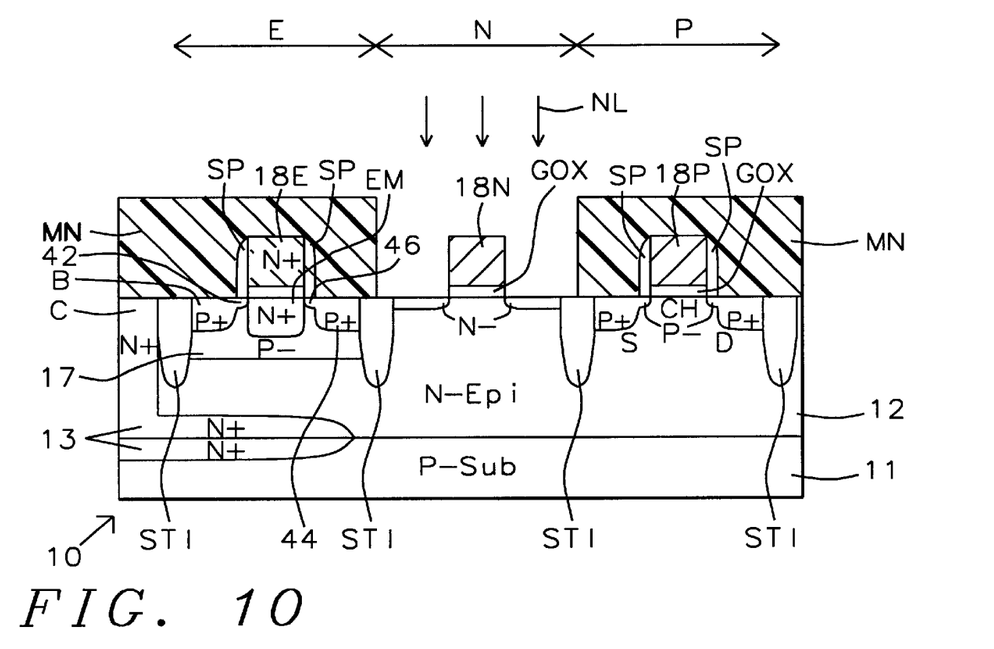

In FIG. 10, device 10 of FIG. 9 is shown after formation of a mask MN exposing the upper surfaces of area N, and covering areas E and P during ion implantation of a light dose of N-type dopant NL lightly doped drain/source (LDD/LDS) N-regions N- have been formed on the left and right of the gate 18N, self-aligned therewith. The dopant NL is preferably arsenic (As) or phosphorus (P) dopant ions implanted with a dose from about 1 E 12 ions/cm$^{-2}$ to about 5 E 14 ions/cm$^{-2}$ of at an energy from about 0.1 keV to about 50 keV. At this stage of the process a dopant concentration from about 1 E 16 atoms/cm$^{-3}$ to about 5 E 18 atoms/cm$^{-3}$ results.

12) Form N+ Regions for NMOS Regions.

Figure 11:
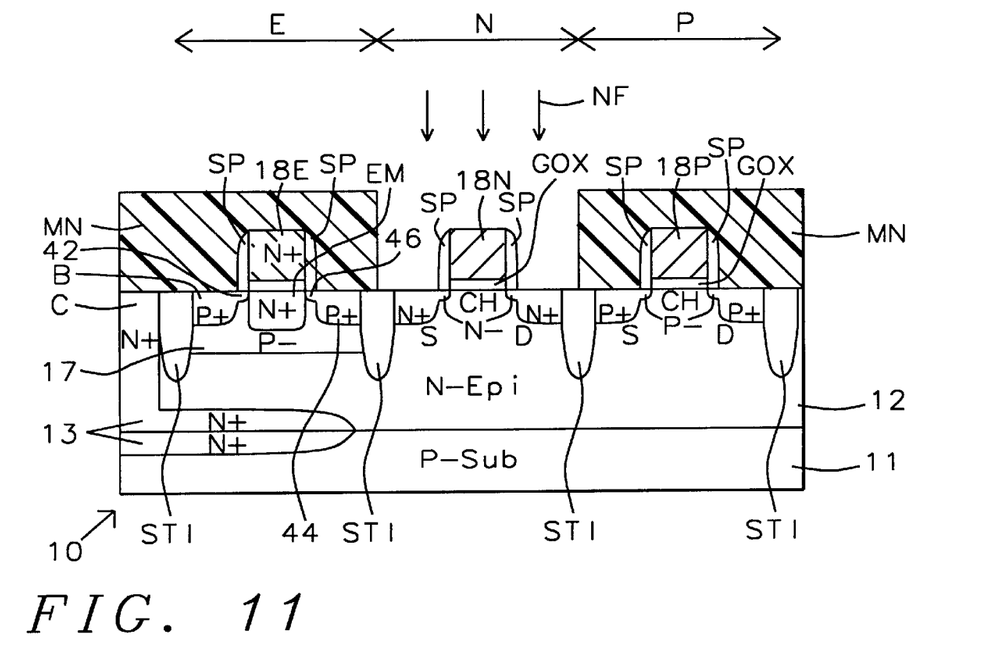

In FIG. 11, the device 10 of FIG. 10 is shown with mask MN remaining after formation of spacers SP on the sides of electrode 18N, exposing the upper surfaces of area N during ion implantation of a full dose of N-type dopant NF for the formation of source/drain regions S/D of gate electrode 18N self-aligned with the spacers SP. Dopant NF is preferably arsenic (N type) dopant ions implanted at an energy from about 0.1 keV to about 50 keV at a dose from about 1 E 15 ions/cm$^{-2}$ to about 1 E 16 ions/cm$^{-2}$, resulting in a concentration from about 1 E 19 atoms/cm$^{-3}$ to about 1 E 19 atoms/cm$^{-3}$.

N+ S/D regions and lightly doped (LDD/LDS) regions N- are located to the left and right of the gate electrode 18N in the conventional manner for an NMOS device.

13) Strip Mask

Figure 12:
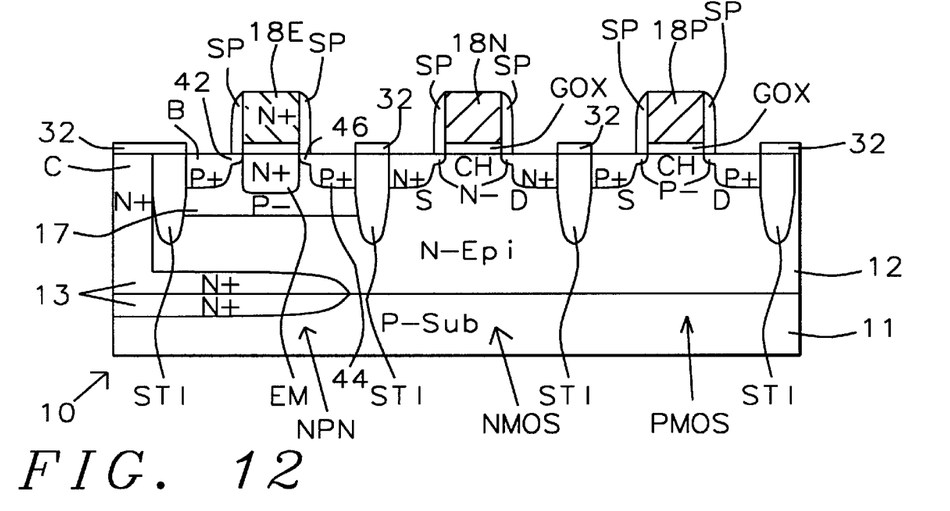

In FIG. 12, the device 10 of FIG. 11 is shown after mask MN has been stripped from device 10. The NPN transistor area includes the P+ doped regions 40 and 44 spaced by the spacers from the emitter portion 18E and the P- lightly doped regions 42 and 46 located below the spacers. The N+ emitter region E is located between the P- lightly doped regions 42/44. A thin oxide layer 32 has been formed superjacent to (over) the collector region C in N-Epi layer 12 and over the STI regions (aside from the P+/N+ regions of the device 10).

14) Backend Process.

Figure 13:
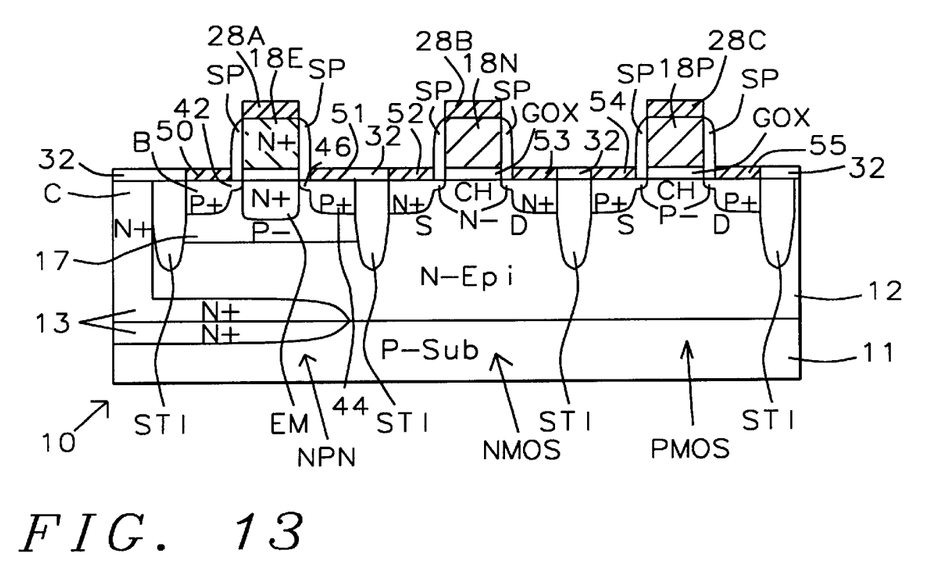
FIG. 13 shows a sectional, elevational view of a fragment of the semiconductor device in accordance with this invention.

In FIG. 13, the device 10 of FIG. 12 is shown after conductive regions 50, 51, 52, 53, 54 and 55 composed of of titanium silicide (TiSi$_x$) have been formed over the N+/P+ regions of device 10 for the purpose of reducing resistance.

In addition, titanium silicide (TiSi$_x$, where x is preferably a positive integer 2, i.e. TiSi$_2$) layers 28A have been formed over the polysilicon emitter portion 18E and gate electrodes 18N and 18P.

While this invention has been described in terms of the above specific embodiment, those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor device comprising:
   a semiconductor substrate doped with a first type of dopant having a top surface providing an interface on which an epitaxial semiconductor layer is formed with the epitaxial layer being counterdoped with an opposite type of dopant, and the epitaxial layer having an upper surface, dielectric, Shallow Trench Isolation (STI) structures formed in the epitaxial layer extending downwardly from the upper surface with the STI structures separating the epitaxial layer into a shallow collector plug area, an emitter/base bipolar region in said epitaxial layer located between a pair of STI structures with the emitter/base bipolar region being lightly doped with the first type of dopant, an NMOS area between a second pair of STi structures, and a PMOS area between a third pair of STI structures with a gap between bottoms of the STI structures and the top surface of the substrate, a buried region for a bipolar transistor formed in the substrate and in the epitaxial semiconductor layer solely at the bottom of the emitter/bipolar region, deep below the upper surface of the epitaxial layer, straddling the interface, and reaching across through the gap in the epitaxial semiconductor layer below an STI) structure, the buried region being counterdoped with the opposite type of dopant, an emitter region formed at the surface of the epitaxial layer in the emitter/base bipolar region being counterdoped with the opposite type of dopant, a base region formed at the surface of the epitaxial layer in the emitter/base bipolar region juxtaposed with the emitter region, the base region being doped with the first type of dopant, a collector plug formed extending through the shallow collector plug area from the upper surface of the epitaxial layer down through the epitaxial layer and through the top surface of the substrate into contact with the buried region, the collector plug being counterdoped with the opposite type of dopant, a thin silicon oxide layer superjacent to the (STI) structures on the top surface of the epitaxial semiconductor layer, a conductive polysilicon layer superjacent to the thin silicon oxide layer, bipolar dopant formed in a portion of the conductive polysilicon bipolar layer over the emitter/base bipolar region of the substrate, dopant having been driven from the polysilicon bipolar layer into the substrate including the thin oxide layer in the bipolar region in the emitter/base bipolar area in the substrate, and doped source/drain regions formed in the NMOS and PMOS areas of the epitaxial semiconductor layer.

2. A device in accordance with claim 1 with said dopant having been rapid thermal annealed into the substrate from the polysilicon bipolar layer.

3. A device in accordance with claim 1 wherein the silicon oxide comprises gate oxide having a thickness from about 5 Å to about 40 Å.

4. A device in accordance with claim 1 wherein:
said dopant was rapid thermal annealed into the substrate from said polysilicon bipolar layer, and
said silicon comprises gate oxide having a thickness from about 5 Å to about 40 Å.

5. A device in accordance with claim 1 wherein the isolation structures are trenches formed in the substrate filled with silicon oxide dielectric.

6. A semiconductor device comprising:
a doped semiconductor substrate doped with P type of dopant having a top surface providing an interface on which an epitaxial semiconductor layer is formed with the epitaxial layer being counterdoped with N-type of dopant, and the epitaxial layer having an upper surface, dielectric, Shallow Trench Isolation (STI) structures, each having tops and bottoms, the STI structures being formed in the upper surface of the epitaxial semiconductor layer, with the STI structures separating the epitaxial semiconductor layer into a plug area, a shallow emitter/bipolar area in said epitaxial layer located between a pair of STI structures with the emitter/base bipolar area being lightly doped with P-type of dopant, an NMOS area, and a PMOS area, the plug area being juxtaposed with the shallow emitter/base bipolar area located and with the plug area being located on a side of the shallow, doped emitter/base bipolar area region away from the NMOS area, and the PMOS area, with a gap between the bottoms of the STI structures and the interface, a buried counterdoped layer for a bipolar transistor in the plug area and the emitter area of the substrate deep below the upper surface of the epitaxial semiconductor layer and straddling the interface, a counterdoped, N+ type, emitter region formed at the surface of the epitaxial layer in the shallow emitter/base bipolar area, a P+ type doped base region formed at the surface of the exitaxial layer in the shallow emitter/base bipolar area juxtaposed with the counterdoped emitter region, a counterdoped, N+ type, collector plug region extending through the shallow collector plug area, reaching from the upper surface of the epitaxial semiconductor layer down through the top surface of the substrate to reach contact with the buried counterdoped layer, a gate oxide layer superjacent to the STI structures on the top surface of the epitaxial semiconductor layer, a conductive polysilicon layer superjacent to the thin silicon oxide layer formed into an emitter conductor over the emitter region and CMOS gates over the NMOS and PMOS regions from the conductive polysilicon layer, the shallow lightly counterdoped P-type region of the emitter/base bipolar area being located below the N+ type doped emitter region and the P+ type doped base region, N+ type emitter dopant implanted in a portion of the conductive polysilicon layer over the counterdoped emitter region of the substrate, the substrate including the thin silicon oxide layer with dopant which had been annealed therein driven from the polysilicon layer into the emitter region in the emitter/bipolar area in the substrate, and source/drain regions formed in the NMOS and PMOS areas of the substrate.

7. A device in accordance with claim 6 wherein said dopant had been rapid thermal annealed into the substrate from said polysilicon bipolar layer.

8. A device in accordance with claim 6 wherein the gate oxide has a thickness from about 5 Å to about 40 Å.

9. A device in accordance with claim 6 wherein:
said dopant had been rapid thermal annealed into the substrate from said polysilicon bipolar layer, and
said silicon oxide comprises gate oxide having a thickness from about 5 Å to about 40 Å.

10. A device in accordance with claim 6 wherein the isolation structures are trenches formed in the substrate filled with silicon oxide dielectric.

* * * * *